United States Patent [19]

Dobson et al.

[11] Patent Number: 4,959,245

[45] Date of Patent: Sep. 25, 1990

[54] METHOD OF MODIFYING A SURFACE OF A BODY USING ELECTROMAGNETIC RADIATION

[75] Inventors: Peter J. Dobson, South Croydon; James H. Neave, Horsham, both of England

[73] Assignee: U.S. Philips Corporation, New York, N.Y.

[21] Appl. No.: 245,861

[22] Filed: Sep. 16, 1988

[30] Foreign Application Priority Data

Oct. 16, 1987 [GB] United Kingdom ............... 8724318

[51] Int. Cl.$^5$ .................................................. B05D 3/06
[52] U.S. Cl. .................................. 427/53.1; 427/54.1; 427/55; 156/620.72; 156/600; 156/612
[58] Field of Search .............. 427/53.1, 54.1, 55, 427/56.1; 156/604, 609, 610, 612, 613, 614, 620.7, 620.72, 620.73

[56] References Cited

U.S. PATENT DOCUMENTS

| | | | |
|---|---|---|---|
| 4,354,083 | 10/1982 | Staats | 219/10.55 F |
| 4,547,651 | 10/1985 | Maruyama | 219/121.74 |
| 4,685,110 | 8/1987 | DeBell et al. | 372/99 |
| 4,780,590 | 10/1988 | Griner et al. | 219/121.65 |

OTHER PUBLICATIONS

Maissel et al., eds., *Handbook of Thin Film Technology*, 1970, McGraw Hill Book Co., pp. 11-13 to 15, 11-21 and 11-25.

*Primary Examiner*—Shrive Beck
*Assistant Examiner*—Marianne L. Padgett
*Attorney, Agent, or Firm*—Paul R. Miller

[57] ABSTRACT

A method of modifying a surface of a body such as a semiconductor body is described in which a beam of electromagnetic radiation is directed towards the surface so that the electromagnetic radiation is incident on the surface at or near the Brewster angle, the electromagnetic radiation incident on the surface preferably being so polarised that the electric vector of the electromagnetic radiation lies in the plane of incidence of the electromagnetic radiation at the surface.

26 Claims, 1 Drawing Sheet

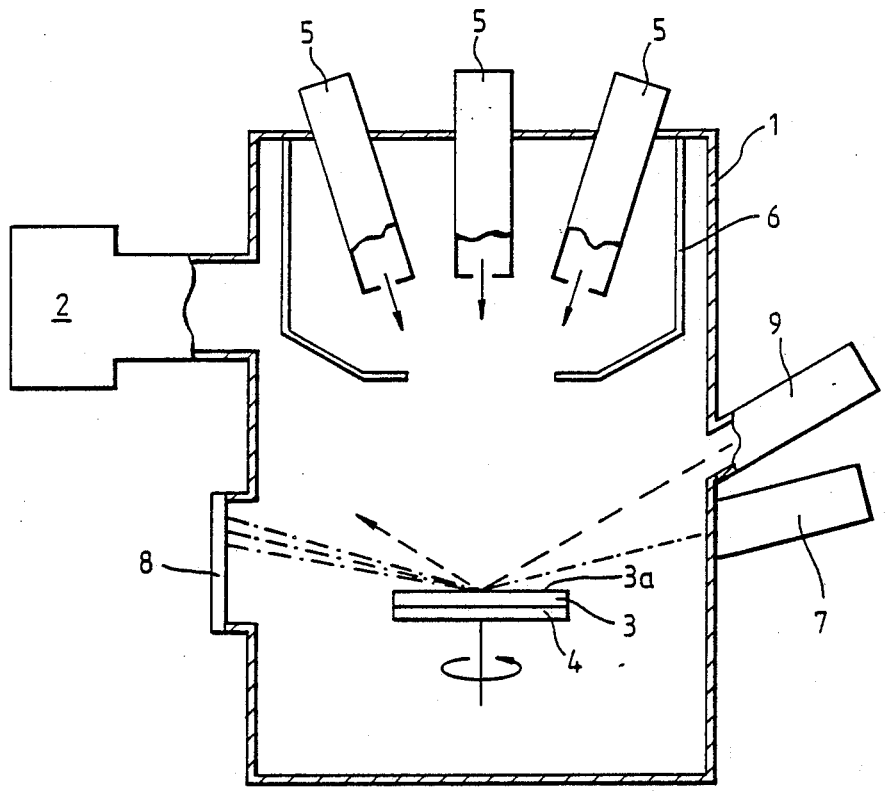

METHOD OF MODIFYING A SURFACE OF A BODY USING ELECTROMAGNETIC RADIATION

This invention relates to a method of modifying a surface of a body, which method comprises directing a beam of electromagnetic radiation towards the surface so that the electromagnetic radiation is incident on the surface.

BACKGROUND OF THE INVENTION

Various methods and apparatus have been described for modifying a surface of a body using electromagnetic radiation. Thus, for example, European Patent Application EP-A-137701, British Patent application GB-A-2119268 and GB-A-2130009 describe various methods of annealing or crystallising material using an electromagnetic radiation source such as a laser. In particular, EP-A-137701 (Fujitsu) describes annealing to ensure silicidation of a refractory metal barrier provided between a silicon surface and an aluminium silicide layer. The British Patent Application GB-A-2119168 describes a method of forming a crystalline semiconductor layer by depositing polycrystalline silicon in a rectangular opening in insulating material onto a monocrystalline silicon substrate, and then annealing the polycrystalline silicon with a CW Ar laser beam to cause recrystallisation while GB-A-2130009 (RCA) describes the thermal annealing of amorphous silicon to produce polycrystalline silicon films.

The use of electromagnetic radiation to modify the surface of a body by radiantly heating the surface during growth of material, for example semiconductor material, on the surface is described in, for example, British Patent Application GB-A-1515571 and GB-A-2170043 while the technique of using electromagnetic radiation to cause dissociation of gaseous material to enable growth of material on the surface is described in, for example, a paper presented at the Internation Symposium on GaAs and related compounds, Karuizawa, Japan 1985 and published under the title "Future epitaxial growth process : Photo-MOMBE" by Kiyoshi Takahashi in the Inst. Phys. Conf. Ser. No 79 Chapter 2 at pages 73 to 78.

SUMMARY OF THE INVENTION

According to the present invention, there is provided a method of modifying a surface of a body, which method comprises directing a beam of electromagnetic radiation towards the surface so that the electromagnetic radiation is incident on the surface, characterised by directing the electromagnetic radiation beam so that the electromagnetic radiation is incident on the surface at or near the Brewster angle.

A method embodying the invention thus enables increased coupling of the incident electromagnetic radiation with the surface. Preferably a method embodying the invention comprises causing the electromagnetic radiation incident on the surface to be so polarised that the electric vector of the electromagnetic radiation lies in the plane of incidence so as to enable maximum or at least even greater coupling of the incident electromagnetic radiation with the surface thereby increasing the transfer of energy from the incident beam into the surface. One or more further electromagnetic radiation beams may be directed toward the surface so that the electromagnetic radiation beam and the further electromagnetic radiation beam or beams interfere. The electromagnetic radiation from the further electromagnetic radiation beam or beams may also be so polarised that the electric vector of the electromagnetic radiation lies in the plane of incidence and may be directed to be incident on the surface at or near the Brewster angle.

Each electromagnetic radiation source may be a laser source although any other suitable source, such as a conventional lamp plus lenses and mirrors may be used.

Preferably, the body is contained within a reaction chamber and the method comprises supplying gaseous material via supply means into the reaction chamber to cause a layer or layers of material to grow on a surface of the body. A pressure below atmospheric may be maintained in the reaction chamber; for example an ultra high vacuum may be maintained and the gaseous material introduced by directing a beam or beam of molecules, atoms or ions into the reaction chamber. Switching means may be provided for altering in a predetermined period the supply of gaseous material so as to cause growth of a layer of one material to stop and growth of a layer of another material to start.

It should be understood that as used herein, the term "gaseous material" includes conventional gases and vapours and also the so-called molecular atomic and ionic beams used in molecular beam epitaxy where an ultra high vacuum exists within the reaction chamber so that the mean free path of the molecules, atoms or ions is comparable to or greater than the distance from the source of the beam to the substrate, i.e. is so that the number of collisions occuring before the molecules, atoms or ions of the beams reach the substrate is negligible.

In one arrangement, at least one of the electromagnetic radiation beams may be directed at the surface of the body during growth of material on the surface and may be used merely to augment or replace a conventional heater in thermal contact with the body.

In another arrangement, at least one of the electromagnetic radiation sources may be activated to radiantly heat the surface only during growth of a layer of a given material. The at least one electromagnetic radiation sources may be activated only during the predetermined period in which the switching means is operated and alter the supply of gaseous material so as to radiantly heat the surface of an already grown layer of one material prior to commencing growth of a layer of different material thereby modifying the interface between the layers. Such methods may be particularly useful in the growth of quantum well or superlattice structures where very thin layers (of the order of 5 to 10 nm or less) of different materials are alternately grown.

The angle of incidence of the electromagnetic radiation beam may be altered so that during growth of a layer or layers of one material the electromagnetic radiation is incident on the surface at or near the Brewster angle and during growth of a layer or layers of a different material the electromagnetic radiation is incident on the surface at an angle of the first material different away from the Brewster angle. Alternatively or additionally the polarisation of the electromagnetic radiation may be altered so that during growth of a layer or layers of one material the electromagnetic radiation is polarised and the electric vector lies in the plane of incidence; and during growth of a layer or layers of a different material, the electric vector has a component outside the plane of incidence. The transfer of energy into the surface, and thereby surface heating, may thus be adjusted to provide the particular optimum temperature required for growth of a particular material.

A method embodying the invention may comprise directing the or at least one of the electromagnetic radiation beams at the surface so as to cause dissociation of gaseous material supplied by the supply means. Such a method may be used in so-called gas source molecular beam epitaxy (GSMBE) or chemical beam epitaxy (CBE) where, for example, alkyls need to be broken down to enable growth of the desired material.

BRIEF DESCRIPTION OF THE DRAWINGS

Embodiments of the invention will now be described, by way of example, with reference to the accompanying drawing in which the single Figure illustrates, in block diagrammatic form and partially in section, apparatus for carrying out methods embodying the invention. It should of course be appreciated that the Figure is a much simplified and very diagrammatic representation of the apparatus and is not drawn to scale, various parts having been relatively enlarged or reduced in the interests of clarity.

DESCRIPTION OF THE INVENTION

Referring now to the single Figure of the drawings, there is illustrated in a very simplified and schematic manner apparatus suitable for carrying out molecular beam epitaxy.

The apparatus comprises a stainless steel chamber 1 capable of withstanding an ultra high vacuum produced by means of a conventional ultra high vacuum pumping system 2.

Although not shown, as is conventional, a sample entry lock system, a preparation chamber and a sample transfer mechanism are provided to enable a sample 3 in the form of a substrate on which material is to be grown to be transferred into the chamber 1 and mounted on a rotatable support stage 4.

Effusion cells 5 are mounted to the vacuum chamber 1 so as to extend into the chamber 1 and as to be directed almost normally of and toward the sample support stage 4. Mechanical shutters close outlets of the effusion cells. Although three effusion cells are shown, the number of effusion cells 5 required will of course depend on the particular material it is desired to grow.

A cryogenically cooled shroud 6 surrounds the effusion cells 5.

Each of the effusion cells 5 may be a standard heated Knudsen cell which has an inner crucible made of reactor-grade graphite or pyrolytic boron nitride in which a pure solid sample of one of the materials from which molecular beams are required, for example gallium (Ga), arsenic (As$_y$ - where y=2 or 4), or aluminium (Al), (where the material to be grown is Ga$_x$Al$_{1-x}$As), is heated in a furnace with a thermocouple arrangement to produce gaseous atoms or molecules which are directed via the outlet of the effusion cell 5 into the vacuum chamber 1 as a molecular beam when the mechanical shutter associated with the cell 5 is open.

A quadrupole mass spectrometer (not shown) may be provided for residual gas analysis and a reflection high energy electron diffraction (RHEED) arrangement for assessment of surface structure. The RHEED arrangement consists simply of a 5-20 keV (kilo electron volt) electron gun 7 and a fluorescent screen, with the electron beam emitted by the gun 7 arranged to be at a very shallow angle (1 to 3 degrees) to the substrate surface.

Additionally there may be an Auger electron spectrometer to determine surface composition and purity.

In addition to the above-described components, which, among others, will be found in conventional molecular beam epitaxy apparatus, such as that manufactured by Varian Associates of Palo Alto, California, USA, the apparatus is provided with an electromagnetic radiation source 9 which is directed towards the surface 3a of the sample 3 and which is preferably capable of producing electromagnetic radiation polarised so that the electric vector lies in the plane of incidence of the electromagnetic radiation on the surface 3a, that is the electromagnetic radiation is plane polarised, or p-polarised. The electromagnetic radiation source 9 is arranged so as to be capable of directing electromagnetic radiation at the surface 3a so that the electromagnetic radiation is incident at or near to (for example within ±5% of) the Brewster angle for the sample 3 or the layer being grown.

The electromagnetic radiation source 9 may comprise a laser source which is preferably p-polarised or alternatively an arrangement of conventional lamps, lenses and mirrors may be used.

Methods embodying the invention and using the apparatus shown in the Figures will now be described by way of example.

The molecular beam sources or effusion cells 5 are of course each arranged to produce a molecular beam of a particular component required for the growth of a particular material on the substrate. Thus taking as an example the growth of alternate thin (for example of the order of 5 to 100 nm or less) layers of different III-V semiconductor compounds on a given III-V semiconductor substrate 3, each of the molecular beam sources 5 will be arranged to produce a molecular beam of a particular group III or group V element.

A first method of embodying the invention will now be described, taking as a particular example growth of alternate epitaxial layers of gallium arsenide (GaAs) and aluminium gallium arsenide (Al$_x$Ga$_{1-x}$As) on a gallium arsenide substrate. Assuming that the gallium arsenide substrate is already positioned on the support stage 4 in the vacuum chamber 1 in which a pressure of about $5 \times 10^{-11}$ Torr is being maintained, the effusion cells 5 are first heated by their respective thermocouples to produce the desired fluxes, all the mechanical shutters being closed at this stage. The GaAs substrate 3 is then heated, for example by a substrate heater, and the shutter of the arsenic source effusion cell 5 opened to subject the substrate to an As$_2$ (or As$_4$) molecular beam or flux of, for example, $4 \times 10^{15}$ atoms cm$^{-2}$sec$^{-1}$, the heating of the substrate being sufficient to remove the volatile oxide from the substrate. Growth is then initiated by bringing the substrate to a desired growth temperature, for example 650 degrees Celsius, in the As$_2$ (or As$_4$) molecular beam and opening the shutters of the gallium and alluminium source effusion cells 5 so as to direct molecular beams of gallium and aluminium atoms of, for example, 1 to $2 \times 10^{15}$ atoms cm$^{-2}$sec$^{-1}$ at the substrate surface to enable an epitaxial layer of Al$_x$Ga$_{1-x}$As with a desired composition to grow, the desired composition being determined by the relative fluxes of aluminium and gallium which themselves will be controlled by the effusion cell temperatures.

Growth of epitaxial layers may be monitored by an appropriate technique, for example the RHEED technique mentioned above (and discussed in detail in, for example European Patent Application, EP-B-110468).

The epitaxial layer of $Al_xGa_{1-x}As$ grown on the GaAs substrate may form a buffer layer and may be for example 50 nm to 100 nm thick. After formation of the desired thickness of the buffer layer, the Al source is switched off by the computer causing the shutter of the aluminium source effusion cell 5 to move to close the outlet of the cell to allow deposition of an epitaxial layer of GaAs to commence.

In the period, of the order of 0.1 seconds, required for the computer to shut off the aluminium molecular beam source by closing the mechanical shutter, the electromagnetic radiation source 9, in this example a laser, is activated by the computer to produce an electromagnetic radiation beam (which may be either a continuous wave (CW) or pulsed laser beam) incident on the exposed surface at an angle at or near to the Brewster angle, that is in this example at an angle of about 74 degrees to the normal to the exposed surface, and which is preferably p-polarised. The laser may be any suitable laser producing electromagnetic radiation of a wavelength or range of wavelengths which is absorbed by the material, as in this example, to heat a surface region of a thickness of 100 nm or less. The electromagnetic radiation should therefore, in this example, have a wavelength or range of wavelengths lying in the range of from approximately 150 nm to approximately 700 nm and may be provided by, for example, a pulsed $N_2$ laser having a wavelength of about 337 nm or a HeCd laser having a wavelength of about 325 nm. The laser may be activated to direct only a single pulse at the surface of the grown layer of $Al_xGa_{1-x}As$.

The laser pulse or pulses act to heat the surface of the already formed epitaxial layer to cause smoothing of the layer on an atomic level. It is thought that this smoothing results from cation surface diffusion (caused by the increased temperature) which leads to increased widths of the growth terraces and so to a smoother layer surface.

The fact that the electromagnetic radiation is p-polarised and incident on the exposed surface of the already grown layer at an angle near to the Brewster angle for GaAs and AlAs means that the coupling of the electromagnetic radiation with the surface of the already grown layer is maximised because at the Brewster angle $\phi$ ($n_i = \tan \phi$, where $n_i$ is the refractive index of the exposed layer) the reflected and refracted rays are perpendicular to one another so that only electromagnetic radiation (for which the electric vector is perpendicular to the plane of incidence) is reflected and in the case of p-polarised electromagnetic radiation the electric vector has no component perpendicular to the plane of incidence. That is, most of the energy in the incident beam is transferred into the surface region.

When the surface temperature of the gallium aluminium arsenide layer has returned to the desired growth temperature, and the shutter of the aluminium effusion cell is fully closed, growth of a layer of gallium arsenide commences.

When a layer of gallium arsenide has grown, as determined by appropriate techniques, e.g. the RHEED technique, to the appropriate thickness of monolayers, for example a thickness of 10 nm, the shutter of the aluminium source effusion cell 5 is moved to open the outlet of the cell. Again, in the period of approximately 0.1 seconds within which the shutter is being opened, the laser source 9 is activated to direct one or more pulses of p-polarised laser electromagnetic radiation at the exposed surface so that the electromagnetic radiation is incident at or near to the Brewster angle so as to heat the exposed surface (this time of the gallium arsenide layer) to smooth the surface as described above.

The above described process may be repeated so that a large number of alternate layers of GaAs and $Al_xGa_{1-x}As$ are formed to provide, for example, depending on the layer thickness, a multiple quantum well or superlattice structure.

The heating effects can be localized at the surface by choosing a short wavelength and short pulse length, for example or heating throughout the sample can be achieved by using longer wavelengths and pulse lengths. The choice depends on the application and on the optical constants of the substrate and layers.

In another method embodying the invention, where alternate layers requiring markedly different growth temperatures are desired to be grown (for example alternate layers of aluminium indium arsenide, and gallium indium arsenide as may be used in the production of high electron mobility transistors (HEMTs), then an electromagnetic radiation source producing p-polarised electromagnetic radiation directed at the layer being grown so as to be incident on its surface at or near the Brewster angle may be used to enable the temperature of the surface on which material is being grown to be changed rapidly.

Thus, for example, a substrate heater in thermal contact with the sample 3 via the support stage 4, or an external radiant heating source, for example another similarly arranged laser source providing p-polarised electromagnetic radiation at or near to the Brewster angle, may be used to heat the surface on which one material is being grown to provide the optimum growth temperature for that material and after the desired growth of that material has ceased, the electromagnetic radiation source 9 may be activated to raise the surface temperature rapidly (in a matter of nanoseconds) to the optimum growth temperature for the material now to be grown on the surface of the already formed layer.

This basic principle may be applied where three or more different materials each requiring a different growth temperature are to be grown with the substrate heater, or a first electromagnetic radiation source, set to the lowest desired growth temperature and the electromagnetic radiation source being activated to provide the desired growth temperatures for the materials having higher growth temperatures.

Different surface temperatures may be attained using the same electromagnetic radiation source by, for example particularly where the electromagnetic radiation source is a laser, altering the duration and/or separation of the pulses of a pulsed electromagnetic radiation beam. Alternatively or additionally, the angle of incidence of the beam and/or the polarisation of the beam may be adjusted so as to alter the degree of coupling of the electromagnetic radiation with the surface. Using such techniques it may also be possible to vary the temperature (continuously or discretely) with time so as to achieve mixing or alloy grading across interfaces between different materials. Such methods may be particularly useful where it is desired to reduce strain at interfaces caused by lattice mismatch between the different materials or in the growth of other III-V, II-VI, II-IV-VI and IV-VI alloy systems in which there are wide differences in vapour pressure/melting points and the growth of multi-layers using present day technology is difficult or impossible.

In yet a further method of embodying the invention, an electromagnetic radiation source providing preferably p-polarised electromagnetic radiation incident on the surface of the substrate or sample at the Brewster angle may be used to provide energy to dissociate molecules adsorbed at the surface, for example to convert $As_4$ to $As_2$ or $As_2$ to As or, for example in gas source molecular beam epitaxy (GSMBE), where one or more of the effusion cells is replaced by a source of a gaseous organometallic compound containing the desired element, to dissociate organometallic molecules. Such dissociation is best achieved with using electronic excitation and therefore electromagnetic radiation in the blue to ultra violet end of the visible spectrum should be used. For example high pressure mercury or xenon arc sources (cw) or pulsed laser sources (for example a nitrogen or excimer laser) could be used.

Where a method embodying the invention involves the photo-dissociation of semiconductor material, for example during deposition or etching of the material, then the photo-dissociation process should be enhanced by selecting the electromagnetic radiation wavelength (and therefore the energy) so that the radiation penetration depth is small, many electron states are involved and the relaxation time for excited electrons is relatively long. It is therefore proposed that, for semiconductor materials such as gallium arsenide, electromagnetic radiation with an energy equivalent to or slightly greater than that of the $E_2$ peak band gap energy which involves a transition between p (occupied) symmetry states or that of the $E_1$ or $E_1+\Delta_1$ peak band gap energies which involve transition between p (occupied) symmetry and s (unoccupied) symmetry states should be used. The $E_2$ peak band gap energy is commonly referred to as the bonding-antibonding energy gap (see, for example, the paper entitled 'Bond Orbital Model II' by Harrison and Ciraci in Physical Review B Volume 10, 15th August 1974 at page 1519). To take some examples, semiconductor materials such as indium arsenide, gallium arsenide, aluminium arsenide and cadmium telluride have bonding-antibonding energy gaps $E_2$ corresponding to wavelengths of about 263 nm, 243 nm, 248 nm and 234 nm, respectively, and if the bonding-antibonding energy gap is to be employed for effecting photo-dissociation then, for example, ArF or KrF excimer lasers could be used to provide electromagnetic radiation of the desired wavelength and thus energy. The $E_1$ peak band gap energies for the above materials correspond to wavelengths of about 492 nm, 422 nm, 318 nm and 377 nm, respectively, while the $E_1+\Delta hd 1$ peak band gap energies correspond to wavelengths of about 441 nm, 387 nm, 299 nm and 323 nm, respectively. Argon lasers operating in CW (continuous wave) mode could be used to supply electromagnetic radiation at the wavelength corresponding to the $E_1$ peak energy and if a conventional frequency doubler is used also corresponding to the bonding-antibonding band gap energy $E_2$.

As indicated above, two or more electromagnetic radiation sources each arranged to provide p-polarised electromagnetic radiation at the Brewster angle may be provided. These sources may be arranged to form an interference pattern at the surface of the sample so causing local changes in temperature or optical wave field at the surface which can be used to modify the growth on a lateral scale of approximately 0.2 micrometers to tens of micrometers resulting in long range periodic microstructures, which may be built into the layers as they are grown. These built-in long range periodicities to multiquantum wells may be used to enhance the coupling of light into or out of such structures. Such periodic microstructures should also exhibit new electrical and optical properties because of their reduced dimensionality.

The heating effect produced by two or more such interfering electromagnetic radiation sources may be used to cause smoothing, alloying or intermixing such as described above at localised areas of an interface.

A method embodying the invention may be applied in any circumstance where electromagnetic radiation is being used to modify a surface or surface layer and may be used in material growth techniques other than MBE, for example, low pressure chemical vapour deposition, sputtering and other thin film production techniques or to modify an existing surface or surface layer. Similarly, a method embodying the invention may be used on or during the growth of layers of materials other then semiconductors, for example insulating, metallic or high temperature superconducting ceramic materials and may be used in the preparation of surfaces for example in removal of thin surface layers, for example, surface oxide layers, prior to growth of epitaxial material as described in EP-A-214690. A method embodying the invention may of course be used in annealing or crystallising layers as described in EP-A-137701, GB-A-2119168 and GB-A-2130009.

From reading the present disclosure, other modifications will be apparent to persons skilled in the art. Such modifications may involve other features which are already known in the design of semiconductor devices and which may be used instead of or in addition to features already described herein. Although claims have been formulated in the application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it related to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of modifying a surface of a body comprising the steps of
   (a) providing a body having a surface,
   (b) supplying gaseous material onto said surface to form at least one layer of said material on said surface, and
   (c) treating said at least one layer by directing a beam of electromagnetic radiation to said layer within ±5° of Brewsters angle for said at least one layer to grow at least one smoothed epitaxial layer of said material on said surface.

2. A method according to claim 1, wherein said step (c) is carried out by polarizing said electromagnetic radiation to form an electric vector of said electromagnetic radiation in the plane of incidence of said electromagnetic radiation on a surface of said at least one layer.

3. A method according to claim 2, further comprising a step (d) of directing at least one further beam of electromagnetic radiation toward said at least one layer on said surface, wherein said beam of electromagnetic radiation and said at least one further beam of electromagnetic radiation interfere.

4. A method according to claim 3, wherein said at least one further beam of electromagnetic radiation is polarized to form the electric vector in the plane of incidence of said at least one further beam, and wherein said step (d) is carried out by forming at least one layer at or near Brewsters angle for said layer.

5. A method according to claim 3 or claim 4, wherein said beam of electromagnetic radiation and said at least one further beam of electromagnetic radiation are formed from laser sources.

6. A method according to claim 5, wherein said step (a) is carried out by providing said body in a reaction chamber, and wherein said step (b) is carried out by using a supply source to direct at least one gaseous component into said reaction chamber.

7. A method according to claim 6, wherein a pressure below atmospheric pressure is maintained in said reaction chamber.

8. A method according to claim 7, wherein said pressure is an ultra high vacuum, and wherein said step (b) is carried out by directing at least a beam of one of molecules, atoms, and ions into said reaction chamber.

9. A method according to claim 6, wherein said step (b) is carried out by using a switching structure to alter the supply of gaseous material in at least one predetermined period such that growth of one material stops and growth of another material begins.

10. A method according to claim 9, wherein said step (c) is carried out to radiantly heat said at least one layer during said growth of said material.

11. A method according to claim 9, wherein said step (c) is carried out by activating at least one of said beam of electromagnetic radiation and said further beam to radiantly heat only a given material during growth of a layer of said given material.

12. A method according to claim 9, wherein said step (c) is carried out by activating at least one of said beam of electromagnetic radiation and said further beam only during said predetermined period such that said gaseous material is altered by radiantly heating an already grown layer of one material prior to beginning growth of another layer of different material in order to modify an interface between said already grown layer and said another layer.

13. A method according to claim 9, wherein said step (c) is carried out by varying angle of incidence of said beam of electromagnetic radiation between within ±5° of Brewsters angle for growth of one layer and an angle different from said Brewsters angle for growth of another layer.

14. A method according to claim 13, wherein said step (c) is carried out by altering polarization of said beam of electromagnetic radiation from polarization with the electric vector in the plane of incidence during growth of at least one layer of a first material to polarization with the electric vector having a component outside said plane of incidence during growth of at least one layer of a second material.

15. A method according to claim 9, wherein at least one of said beam of electromagnetic radiation and said further beam are directed to cause dissociation of gaseous material from said supply source.

16. A method according to claim 6, wherein said step (c) is carried out to radiantly heat said at least one layer during said growth of said material.

17. A method according to claim 6, wherein at least one of said beam of electromagnetic radiation and said further beam are directed to cause dissociation of gaseous material from said supply source.

18. A method according to claim 1 or claim 2, wherein said beam of electromagnetic radiation is formed from a laser source.

19. A method according to claim 1 or claim 2, wherein said step (a) is carried out by providing said body in a reaction chamber, and wherein said step (b) is carried out by using a supply source to direct at least one gaseous component into said reaction chamber.

20. A method according to claim 19, wherein a pressure below atmospheric pressure is maintained in said reaction chamber.

21. A method according to claim 20, wherein said pressure is an ultra high vacuum, and wherein said step (b) is carried out by directing at least a beam of one of molecules, atoms, and ions into said reaction chamber.

22. A method according to claim 19, wherein said step (b) is carried out by using a switching structure to alter the supply of gaseous material in at least one predetermined period such that growth of one material stops and growth of another material begins.

23. A method according to claim 22, wherein said step (c) is carried out to radiantly heat said at least one layer during said growth of said material.

24. A method according to claim 22, wherein said step (c) is carried out by varying angle of incidence of said beam of electromagnetic radiation between within ±5° of Brewsters angle for growth of one layer and an angle different from said Brewsters angle for growth of another layer.

25. A method according to claim 24, wherein said step (c) is carried out by altering polarization of said beam of electromagnetic radiation from polarization with the electric vector in the plane of incidence during growth of at least one layer of a first material to polarization with the electric vector having a component outside plane of incidence during growth of at least one layer of a second material.

26. A method according to claim 19, wherein said step (c) is carried out to radiantly heat said at least one layer during said growth of said material.

* * * * *